United States Patent
Kato et al.

(10) Patent No.: US 8,991,917 B2
(45) Date of Patent: *Mar. 31, 2015

(54) CONDUCTIVE FIBER CONNECTING METHOD AND STRUCTURE

(75) Inventors: Kohei Kato, Kariya (JP); Fumitoshi Akaike, Nissin (JP); Seiya Nishimura, Okazaki (JP)

(73) Assignee: Toyota Boshoku Kabushiki Kaisha, Aichi-Ken (JP)

( * ) Notice: Subject to any disclaimer, the term of this patent is extended or adjusted under 35 U.S.C. 154(b) by 414 days.

This patent is subject to a terminal disclaimer.

(21) Appl. No.: 12/581,383

(22) Filed: Oct. 19, 2009

(65) Prior Publication Data

US 2010/0101858 A1 Apr. 29, 2010

(30) Foreign Application Priority Data

Oct. 24, 2008 (JP) .................................. 2008-274337

(51) Int. Cl.
| | | |
|---|---|---|
| *A47C 7/62* | (2006.01) | |
| *B60N 2/00* | (2006.01) | |
| *B60N 2/58* | (2006.01) | |
| *B60R 21/015* | (2006.01) | |
| *H01R 4/04* | (2006.01) | |
| *H01R 12/61* | (2011.01) | |
| *H01R 12/63* | (2011.01) | |
| *H05K 1/03* | (2006.01) | |
| *H05K 3/32* | (2006.01) | |

(52) U.S. Cl.
CPC ............... *H01R 12/61* (2013.01); *B60N 2/002* (2013.01); *B60N 2/58* (2013.01); *B60R 21/01532* (2013.01); *H01R 4/04* (2013.01); *H01R 12/63* (2013.01); *H01R 2201/26* (2013.01); *H05K 1/038* (2013.01); *H05K 3/325* (2013.01); *H05K 2201/0281* (2013.01); *H05K 2201/10386* (2013.01); *H05K 2201/10409* (2013.01)
USPC ....................................... 297/217.3; 297/217.2

(58) Field of Classification Search
USPC ......... 174/68.2; 442/110, 185, 228, 232, 376, 442/378; 297/217.2, 217.3
See application file for complete search history.

(56) References Cited

U.S. PATENT DOCUMENTS

| | | | | |
|---|---|---|---|---|
| 4,250,397 A | * | 2/1981 | Gray et al. ..................... | 392/435 |
| 5,344,696 A | * | 9/1994 | Hastings et al. .............. | 428/220 |
| 5,925,275 A | * | 7/1999 | Lawson et al. ................ | 219/543 |
| 6,831,565 B2 | * | 12/2004 | Wanami et al. ............... | 340/667 |
| 6,888,112 B2 | * | 5/2005 | Rock et al. .................... | 219/545 |

(Continued)

FOREIGN PATENT DOCUMENTS

| | | |
|---|---|---|
| JP | 60-43432 | 3/1985 |
| JP | 11-286231 | 10/1999 |

(Continued)

OTHER PUBLICATIONS

Definition of "capacitance", Wikipedia, http://en.wikipedia.org/wiki/Capacitance, Sep. 9, 2012.*

(Continued)

*Primary Examiner* — Andrew Piziali
(74) *Attorney, Agent, or Firm* — Greenblum & Bernstein, P.L.C.

(57) ABSTRACT

A method and a structure of electrically connecting a conductive fiber in fabric to an external device electrically connects the conductive fiber to the external device by pressing a conductive member that is electrically connected to the external device against the fabric.

16 Claims, 6 Drawing Sheets

(56) References Cited

U.S. PATENT DOCUMENTS

| | | | |
|---|---|---|---|
| 8,029,058 B2 * | 10/2011 | Kato et al. | 297/217.3 |
| 8,201,880 B2 * | 6/2012 | Kato et al. | 297/180.12 |
| 2003/0071738 A1 * | 4/2003 | Joly et al. | 340/667 |
| 2009/0306916 A1 * | 12/2009 | Nagase | 702/65 |

FOREIGN PATENT DOCUMENTS

| | | |
|---|---|---|
| JP | 2000-038077 | 2/2000 |
| JP | 2003-50282 | 2/2003 |
| JP | 2003-266599 | 9/2003 |

OTHER PUBLICATIONS

English language Abstract of JP 2003-50282, Feb. 21, 2003.

Japaness Office action, dated Nov. 27, 2012 along with an English-language translation thereof.

\* cited by examiner

CONDUCTIVE FIBER CONNECTING METHOD AND STRUCTURE

INCORPORATION BY REFERENCE

The disclosure of Japanese Patent Application No. 2008-274337 filed on Oct. 24, 2008 including the specification, drawings and abstract is incorporated herein by reference in its entirety.

BACKGROUND OF THE INVENTION

1. Field of the Invention

The invention relates to a conductive fiber connecting method and structure. More particularly, the invention relates to a method of electrically connecting a conductive fiber in fabric to an external device, as well as the structure of the fabric containing the conductive fiber that is connected to an external device.

2. Description of the Related Art

Japanese Patent Application Publication No. 2003-50282 (JP-A-2003-50282), for example, describes a vehicle seat to which this kind of connecting method is applied. With the technology described in JP-A-2003-50282, a substrate on which a plurality of conductive wires as conductive fibers are arranged is provided on a seat cushion and/or a seat back of a vehicle seat. The ends of the conductive wires are connected to a capacitance detector, which is an external device, via wiring connections. Accordingly, it is possible to determine whether an occupant is seated in a vehicle seat by detecting the capacitance between conductive wires. This makes it possible to perform control to not activate an air bag corresponding to a vehicle seat in which an occupant is not seated, if the vehicle is involved in an accident, for example.

However, according to JP-A-2003-50282, when connecting the plurality of wires to the capacitance detector, the wiring from each conductive wire is connected separately to the capacitance detector, which makes the electrical wiring between the plurality of conductive wires and the capacitance detector complicated.

SUMMARY OF THE INVENTION

This invention provides a method and structure that facilitates electrically connecting a conductive fiber in fabric to an external device.

A first aspect of the invention relates to a method of electrically connecting a conductive fiber in fabric to an external device. This conductive fiber connecting method includes pressing a conductive member, electrically connected to the external device, against the fabric so as to electrically connect the conductive fiber to the external device. According to this structure, when electrically connecting the conductive fiber in the fabric to the external device, the electrical wiring can be accomplished by simply using copper tape (a conductive member), for example, which obviates the need for electrical wiring with the wiring connections described in the related art. That is, it is no longer necessary to connect the conductive fiber to a wire. Instead, all that need be done is to attach the copper tape, so the electrical wiring can be simplified.

Also, in the conductive fiber connecting method according to the first aspect, the conductive fiber may be electrically connected at one end to the conductive member. According to this structure, copper tape (a conductive member), for example, may be attached to the fabric on one end portion side of the conductive fiber. Therefore, even if the fabric is applied to a seat cushion cover of a vehicle seat and it is determined whether an occupant is seated in the vehicle seat, the copper tape can be attached to a portion of the cushion cover that would not be noticed or felt by the occupant, so the conductive member would not feel uncomfortable to the occupant.

Also, in the conductive fiber connecting method according to the first aspect, the fabric may include a plurality of parallel conductive fibers, and the conductive member may be connected to the plurality of conductive fibers in a manner so as to create a bridge between each of the plurality of conductive fibers. According to this structure, the plurality of conductive fibers are woven into the fabric in such a manner that they are parallel with one another. Therefore, if the fabric is applied to the seat cushion cover of the vehicle seat and it is determined whether an occupant is seated in the vehicle seat, that determination can be made more accurately.

Also, the conductive fiber connecting method described above may also include: overlapping the edges of two sheets of the fabric; sandwiching the overlapping edges of the two sheets of the fabric from the outside by the conductive member; and pressing the conductive member against the two sheets of the fabric so as to electrically connect the conductive fibers to the external device. According to this structure, even if the fabric is applied to the seat cushion cover of the vehicle seat, it is possible to change the colors and/or materials of the fabric at the front and back on the seating surface on which the occupant sits. For example, it is possible to have the fabric toward the front be black and the fabric toward the back be red.

Also, in the conductive fiber connecting method described above, the fabric may cover the seating surface of a seat cushion. Applying the fabric to a seat cushion cover of a vehicle seat in this way makes it possible to determine whether an occupant is seated in the vehicle seat.

A second aspect of the invention relates to a conductive fiber connecting structure in which a conductive fiber in fabric is electrically connected to an external device. This conductive fiber connecting structure includes a conductive member that electrically connects the conductive fiber to the external device, and an adhesive that is applied to one side of the conductive member so that the conductive member adheres to the fabric and contacts the conductive fiber, thereby electrically connecting the conductive fiber with the external device.

A third aspect of the invention relates to a conductive fiber connecting structure in which a conductive fiber in fabric is electrically connected to an external device. This conductive fiber connecting structure includes a conductive member that electrically connects the conductive fiber to the external device. The conductive member is pressed against the fabric such that the conductive member contacts the conductive fiber, and the conductive fiber is electrically connected to the external device.

In the second and third aspects as well, when electrically connecting the conductive fiber in the fabric to the external device, it is not necessary to have the electrical wiring be done by wiring connections as described in the related art. Instead, the electrical wiring can be done simply by attaching copper tape, for example.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

Figures 1A, 1B:
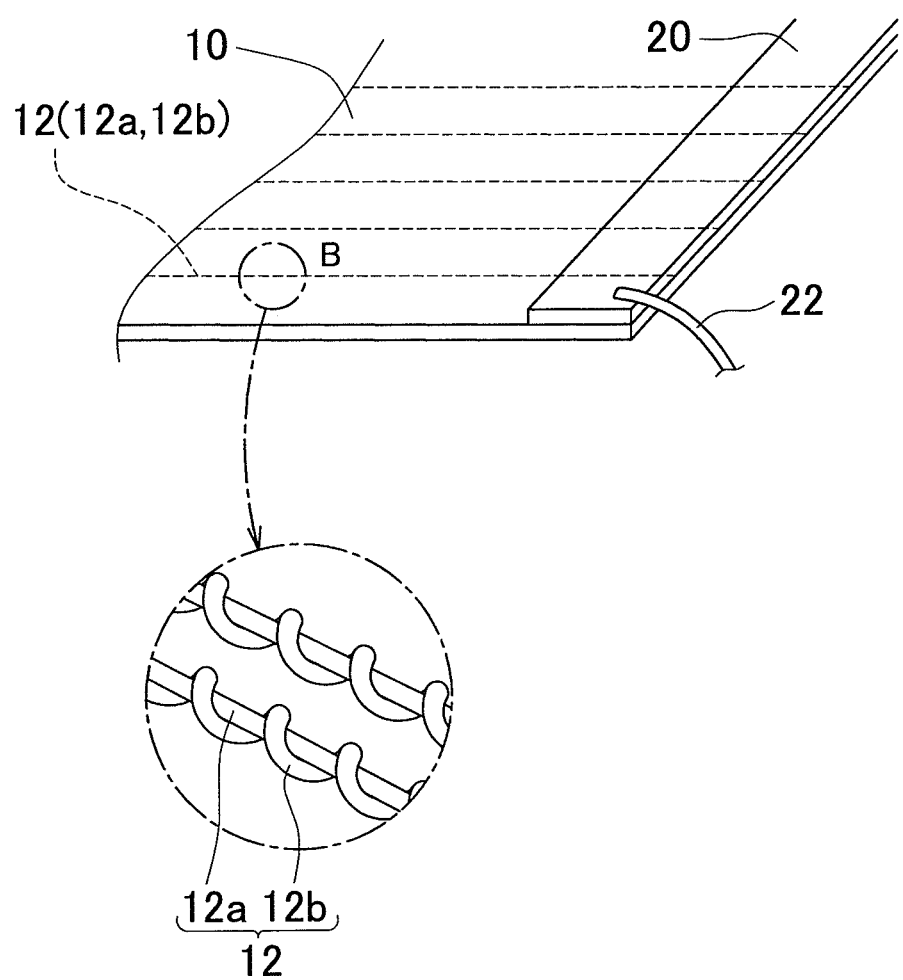
FIG. 1A is a view illustrating a method of connecting conductive fibers according to a first example embodiment of the invention.
FIG. 1B is an enlarged view showing a portion of the conductive fiber in FIG. 1A.
Figure 2:
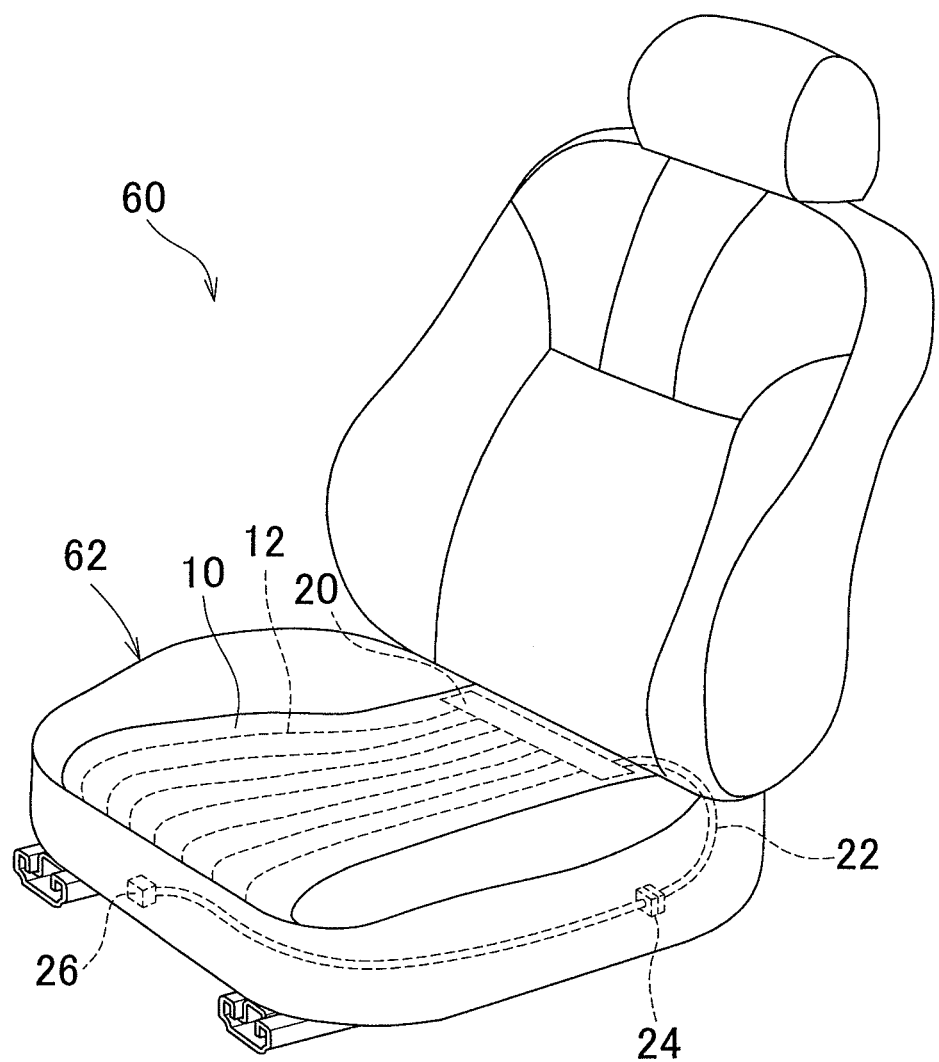
FIG. 2 is a view in which the connecting method shown in FIG. 1A has been applied to a vehicle seat.

Example embodiments of the present invention will be described in greater detail below with reference to the accompanying drawings. First, a first example embodiment will be described with reference to FIGS. 1 and 2. FIG. 1A is a view illustrating a method of connecting conductive fibers according to the first example embodiment of the invention, and FIG. 2 is a view in which the connecting method shown in FIG. 1A has been applied to a vehicle seat. In this first example embodiment, copper tape 20 will be described as an example of a conductive member.

First, the structure of fabric 10 will be described with reference to FIGS. 1A and 1B. Multiple composite threads 12 are woven into this fabric 10 in one direction. Each of the multiple composite threads 12 includes a conductive fiber 12a and a nonconductive material 12b that is wound around the conductive fiber 12a at appropriate intervals. The conductive fiber 12a is a stainless-steel fiber, for example, and the nonconductive material 12b is a twisted thread, for example.

The conductive fibers 12a of the multiple composite threads 12 are all electrically connected to the copper tape 20 at one end. That is, the copper tape 20 is attached to one end side of each conductive fiber 12a of the fabric 10. By attaching the copper tape 20 in this way, the copper tape 20 is pressed against the fabric 10 so that the conductive members are retained while maintaining contact with the fabric. As a result, the copper tape 20 can be reliably connected to the conductive fibers 12a (i.e., connected in a reliable conductive state). Incidentally, one end of a cable 22 is electrically connected to this copper tape 20, so the conductive fibers 12a are ultimately electrically connected to the cable 22.

Next, an example in which the fabric 10 described above is applied to a cushion cover of a seat cushion 62 of a vehicle seat 60 will be described with reference to FIG. 2. Multiple composite threads 12 described above are woven, in the longitudinal direction, into the seating surface of the cushion cover on which an occupant sits. The copper tape 20 is attached to the rear end portion of the cushion cover so that the rear end portions of the conductive fibers 12a of the multiple composite threads 12 are electrically connected together.

The cable 22 electrically connected to the copper tape 20 is electrically connected to a capacitance detector 26, i.e., the external device, via a connector 24. This capacitance detector 26 is also electrically connected to a cushion frame, not shown, which is made of conductive material. Therefore, it is possible to determine whether an occupant is seated in the vehicle seat 60, just as in the related art, by detecting the capacitance between the conductive fibers 12a and the cushion frame. Accordingly, it is possible to perform control to not activate an air bag corresponding to the vehicle seat 60 in which an occupant is not seated, if the vehicle is involved in an accident, for example.

The method of connecting the conductive fibers according to the first example embodiment of the invention is as described above. Accordingly, when electrically connecting the conductive fibers 12a in the fabric 10 to the external device, the electrical wiring can be accomplished by simply using the copper tape 20, which obviates the need to connect electrical wiring in the manner described in the related art. As a result, it is no longer necessary to connect the conductive fibers 12a to the wires. Instead, all that need be done is to attach the copper tape 20, thereby simplifying the wiring process.

In addition, according to this structure, the copper tape 20 is attached to the fabric 10 at one end of the conductive fibers 12a. Therefore, for example, even if the fabric 10 is applied to the cushion cover of the seat cushion 62 and it is determined whether an occupant is seated in the vehicle seat 60, the copper tape 20 can be attached to a portion of the cushion cover that would not be noticed or felt by the occupant (such as the rear end portion of the cushion cover in FIG. 2). Accordingly, even if the copper tape 20 is attached to the cushion cover, it would not cause discomfort to the occupant.

Also, according to this structure, the plurality of conductive fibers 12a are woven into the fabric 10 in such a manner that they are parallel to one another. Therefore, as described above, if the fabric 10 is applied to the cushion cover of the seat cushion 62 of the vehicle seat 60 and it is determined whether an occupant is seated in the vehicle seat 60, that determination may be made more accurately.

Figure 3:
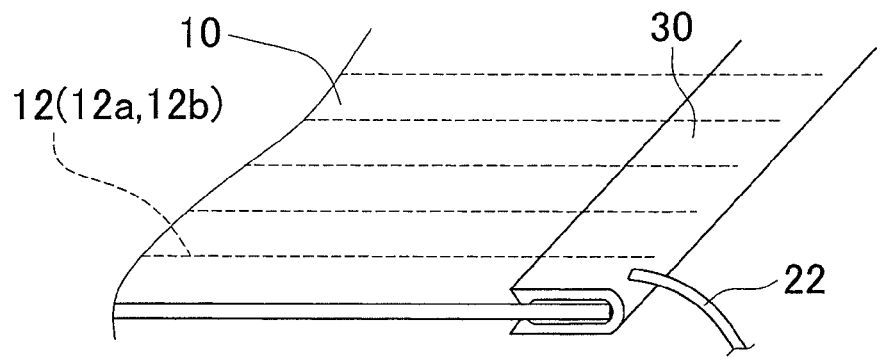
FIG. 3 is a view illustrating a method of connecting conductive fibers according to a second example embodiment of the invention.

Next, a second example embodiment will be described with reference to FIG. 3. FIG. 3 is a view illustrating a method of connecting conductive fibers according to the second example embodiment of the invention. The second example embodiment differs from the first example embodiment described above in that the conductive member is a clip member 30 that is a conductive clip. Incidentally, in the description below, members having the same or equivalent structure as members in the first example embodiment will be denoted by the same reference characters in the drawings and redundant descriptions will be omitted. The same also applies to the third and subsequent example embodiments, which will be described later.

As shown in FIG. 3, both free ends of the clip member 30 are able to deform. The reaction force of this deformation enables the clip member 30 to grab the edge of the fabric 10. The conductive fibers 12a of the multiple composite threads 12 are all electrically connected to the clip member 30 at one end. At this time, the reaction force of the deformation of the clip member 30 keeps the clip member 30 pressed against the fabric 10. As a result, the clip member 30 can be reliably connected to the conductive fibers 12a (i.e., connected in a reliable conductive state). Therefore, the second example embodiment is able to yield the same operational effects as the first example embodiment.

Figure 4:
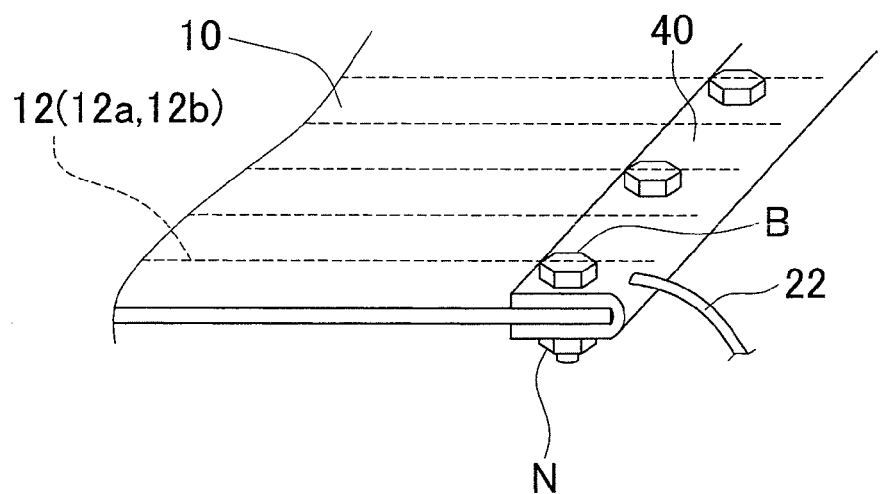
FIG. 4 is a view illustrating a method of connecting conductive fibers according to a third example embodiment of the invention.

Next, a third example embodiment will be described with reference to FIG. 4. FIG. 4 is a view illustrating a method of connecting conductive fibers according to the third example embodiment of the invention. The third example embodiment differs from the first example embodiment described above in that the conductive member is a retaining member 40 that is formed in a general U-shape and is conductive.

As shown in FIG. 4, the retaining member 40 sandwiches the edge of the fabric 10 and be kept this way using nuts N and bolts B. The conductive fibers 12a of the multiple composite threads 12 are all electrically connected to the retaining member 40 at one end. At this time, the fastening force of the nuts N and bolts B keeps the retaining member 40 pressed against the fabric 10. As a result, the retaining member 40 is reliably connected to the conductive fibers 12a (i.e., connected in a reliable conductive state). Therefore, the third example embodiment is also able to yield the same operational effects as the first example embodiment.

Figure 5:
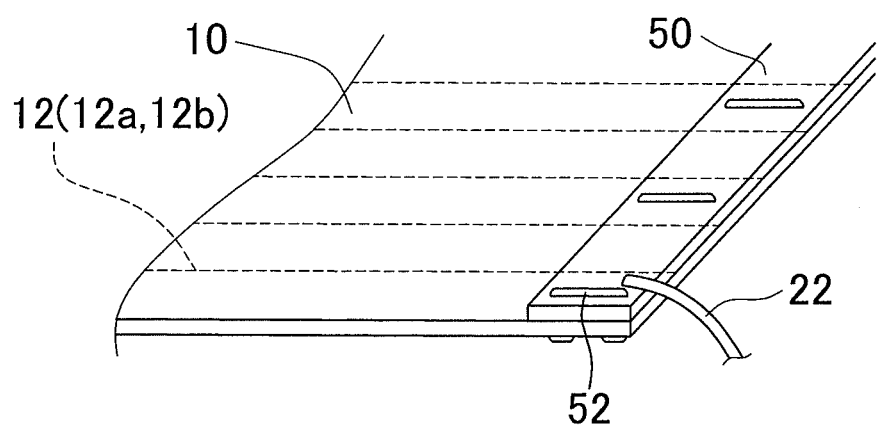
FIG. 5 is a view illustrating a method of connecting conductive fibers according to a fourth example embodiment of the invention.

Next, a fourth example embodiment will be described with reference to FIG. 5. FIG. 5 is a view illustrating a method of connecting conductive fibers according to the fourth example embodiment of the invention. The fourth example embodiment differs from the first example embodiment described above in that the conductive member is a thin plate member 50 that is conductive.

As shown in FIG. 5, the thin plate member 50 can be pressed against the edge of the fabric 10 and held there by a fastening member (such as staples (registered trademark) 52. The conductive fibers 12a of the multiple composite threads 12 are all electrically connected to the thin plate member 50 at one end. At this time, the fastening force of the fastening member 52 keeps the thin plate member 50 pressed against the fabric 10. As a result, the thin plate member 50 can be reliably connected to the conductive fibers 12a (i.e., connected in a reliable conductive state). Therefore, this fourth example embodiment is also able to yield the same operational effects as the first example embodiment.

Figure 6:
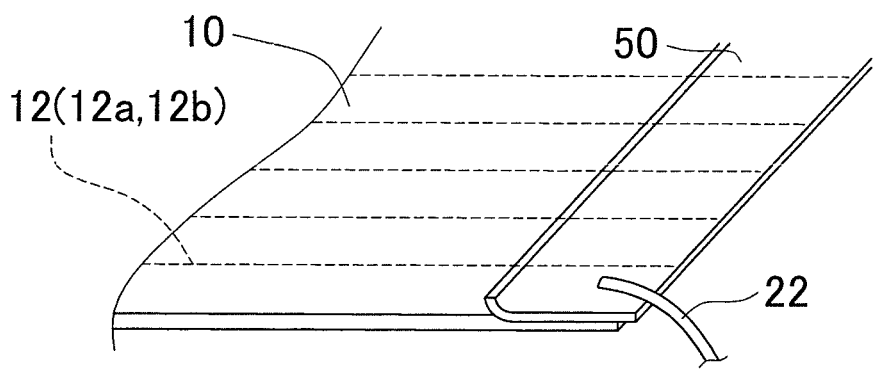
FIG. 6 is a view illustrating a method of connecting conductive fibers according to a fifth example embodiment of the invention.

Next, a fifth example embodiment will be described with reference to FIG. 6. FIG. 6 is a view illustrating a method of connecting conductive fibers according to the fifth example embodiment of the invention. The fifth example embodiment differs from the fourth example embodiment described above in that the thin plate member 50 is retained by heat crimping.

As shown in FIG. 6, the thin plate member 50 is pressed against the edge of the fabric 10 and held there by heat crimping. Because heat crimping is well-known technology, it will not be described in detail here. The conductive fibers 12a of the multiple composite threads 12 are all electrically connected to the thin plate member 50 at one end. At this time, the holding force of the heat crimping keeps the thin plate member 50 pressed against the fabric 10. As a result, the thin plate member 50 can be reliably connected to the conductive fibers 12a (i.e., connected in a reliable conductive state). Therefore, this fifth example embodiment is also able to yield the same operational effects as the fourth example embodiment.

Figures 7A, 7B:
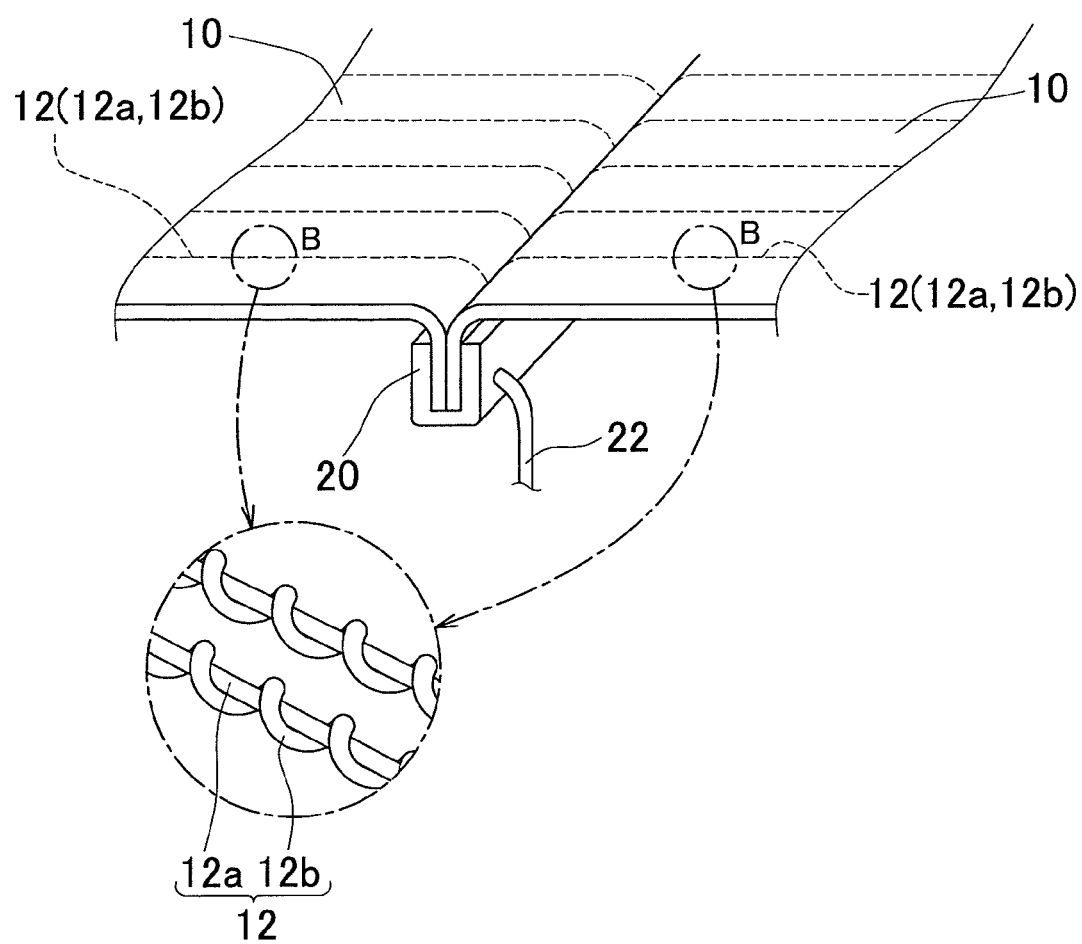
FIG. 7A is a view illustrating a method of connecting conductive fibers according to a sixth example embodiment of the invention.
FIG. 7B is an enlarged view showing a portion of the conductive fiber in FIG. 7A.
Figure 8:
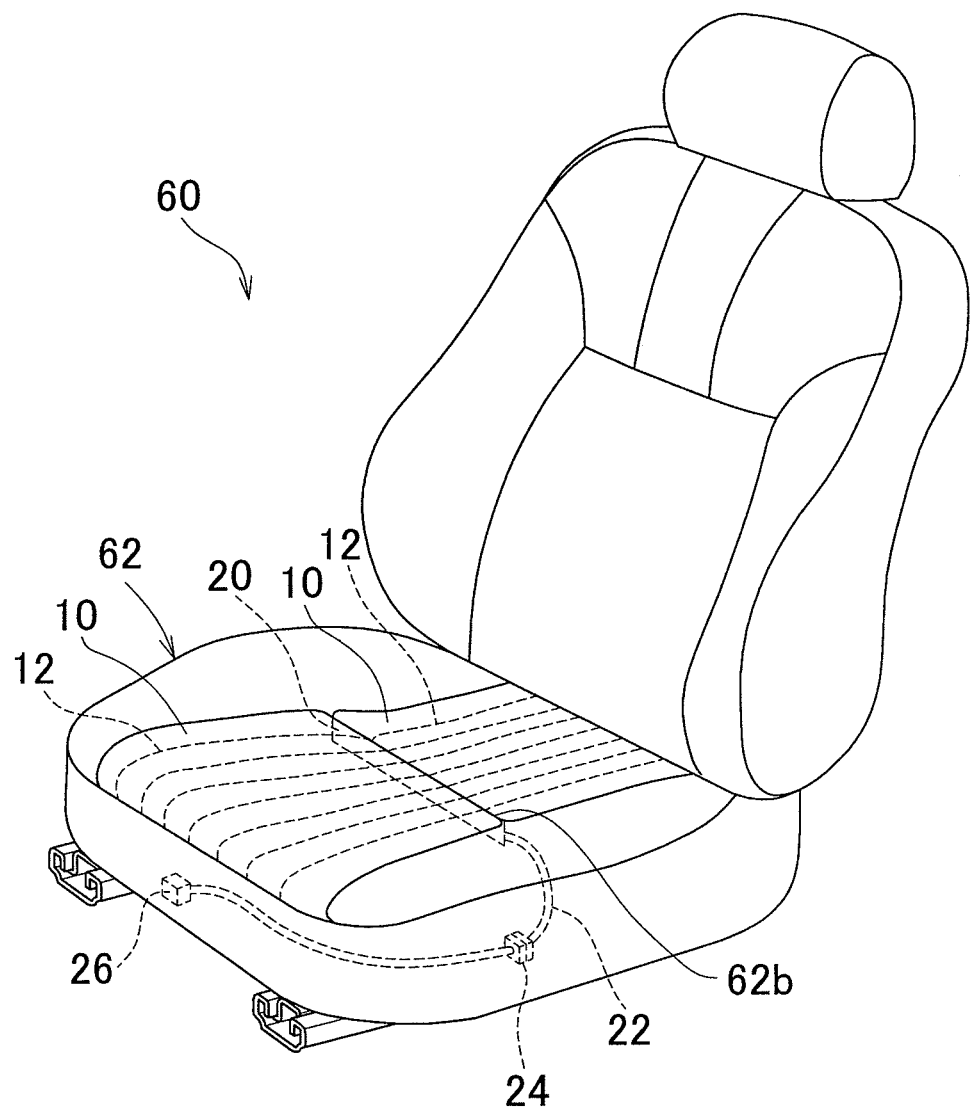
FIG. 8 is a view in which the connecting method shown in FIG. 7A has been applied to a vehicle seat.

Next, a sixth example embodiment will be described with reference to FIGS. 7 and 8. FIG. 7A is a view illustrating a method of connecting conductive fibers according to the sixth example embodiment of the invention, and FIG. 8 is a view in which the connecting method shown in FIG. 7A has been applied to a vehicle seat. The sixth example embodiment differs from the first example embodiment described above in that two sheets of the fabric 10 are connected using the copper tape 20.

The edges of two sheets of the fabric 10 are overlapped face to face and the copper tape 20 is attached to the two sheets of fabric 10 so that it sandwiches the outer surfaces of the two overlapping sheets of fabric 10, as shown in FIGS. 7A and 7B. Attaching the copper tape 20 in this way presses it against the two sheets of the fabric 10 and holds it there. As a result, the copper tape 20 can be reliably connected to the conductive fibers 12a of the two sheets of the fabric 10 (i.e., connected in a reliable conductive state). Therefore, the sixth example embodiment is also able to yield the same operational effects as the first example embodiment.

Incidentally, as shown in FIG. 8, the two sheets of the fabric 10 may be applied to the cushion cover of the seat cushion 62 of the vehicle seat, just as in the first example embodiment. When the two sheets of fabric 10 are applied to the seat cushion cover in this way, it is possible to change the colors and/or materials of the fabric 10 at the front and back on the seating surface on which the occupant sits. For example, it is possible to have the fabric 10 toward the front be black and the fabric 10 toward the back be red.

At this time, the two sheets of the fabric 10 are preferably applied to the cushion cover such that the portion where the two sheets of fabric 10 are connected is arranged at an insert groove 62b formed in the seating surface. This type of arrangement will not cause the occupant any discomfort even if the connecting portion of the two sheets of the fabric 10 is placed under the seated occupant.

Also, with this type of arrangement, the copper tape 20 is placed under the seated occupant, so the degree of pressure applied to the conductive fibers 12a by the copper tape 20 increases when the occupant is seated in the vehicle seat 60. This helps to prevent the copper tape 20 from deteriorating and peeling off.

While the invention has been described with reference to example embodiments thereof, it should be understood that the invention is not limited to the example embodiments or constructions. For example, in the sixth example embodiment, two sheets of the fabric 10 are connected by the copper tape 20. However, the invention is not limited to this. For example, the two sheets of the fabric 10 may instead be connected by being sandwiched together using a clip, as in the second example embodiment, retained by nuts and bolts as in the third example embodiment, retained by a fastening member as in the fourth example embodiment, or retained by heat crimping as in the fifth example embodiment.

What is claimed is:

1. A vehicle seat comprising:
a frame member, a cushion provided on the cushion frame, and a cushion cover that covers the cushion,
the cushion cover including:
a seating surface having a conductive fiber connecting structure in which a conductive fiber in fabric is electrically connected to a capacitance detector electrically connected to the frame member,
the conductive fiber connecting structure including:
a conductive member that electrically connects the conductive fiber to the capacitance detector; and
an adhesive that is applied to one side of the conductive member so that the conductive member adheres to the fabric and contacts the conductive fiber, thereby electrically connecting the conductive fiber with the capacitance detector.

2. The vehicle seat according to claim 1, wherein the fabric includes a plurality of parallel conductive fibers, and the conductive member adheres to the fabric in a manner so as to create a bridge between each of the plurality of conductive fibers.

3. The vehicle seat according to claim 1, wherein the edges of two sheets of the fabric are overlapped face to face, the overlapping edges of the two sheets of the fabric are sandwiched from the outside by the conductive member, and the conductive member adheres to the overlapping edges of the two sheets.

4. The vehicle seat according to claim 1, wherein the conductive member is an adhesive tape made of a conductive material.

5. The vehicle seat according to claim 1, wherein the fabric includes a nonconductive material and the conductive fiber, and the nonconductive material is wound around the conductive fiber.

6. The vehicle seat according to claim 1, wherein the capacitance detector is configured to detect a capacitance between the conductive fiber and the frame member so as to determine whether an occupant is seated in the vehicle seat.

7. The vehicle seat according to claim 1, wherein the adhesive is disposed at one of a rear end portion of the cushion and a middle portion of the cushion.

8. A vehicle seat comprising:
  a frame member, a cushion provided on the frame member, and a cushion cover that covers the cushion,
  the cushion cover including:
    a seating surface having a conductive fiber connecting structure in which a conductive fiber in fabric is electrically connected to a capacitance detector electrically connected to the frame member,
    the conductive fiber connecting structure including:
      a conductive member that electrically connects the conductive fiber to the capacitance detector,
      wherein the conductive member is pressed against the fabric such that the conductive member contacts the conductive fiber, and the conductive fiber is electrically connected to the capacitance detector.

9. The vehicle seat according to claim 8, wherein the conductive member is an adhesive tape made of a conductive material.

10. The vehicle seat according to claim 8, wherein the conductive member is a clip in which at least a pair of retaining portions are formed of conductive material; and the clip grabs the fabric from an end portion of the fabric.

11. The vehicle seat according to claim 8, wherein the conductive member remains pressed against the fabric by being pressed against the fabric and is fastened to the fabric using a fastening member.

12. The vehicle seat according to claim 11, wherein the conductive member is formed from a pair of retaining members that sandwich both sides of the fabric; and the conductive member is fastened to the fabric by fastening together the retaining members by using the fastening member.

13. The vehicle seat according to claim 8, wherein the fabric includes a plurality of parallel conductive fibers, and the conductive member is connected to the plurality of conductive fibers in a manner so as to create a bridge between each of the plurality of conductive fibers.

14. The vehicle seat according to claim 8, wherein the edges of two sheets of the fabric are overlapped face to face, the overlapping edges of the fabric sheets are sandwiched from the outside by the conductive member.

15. The vehicle seat according to claim 8, wherein the fabric includes a nonconductive material and the conductive fiber, and the nonconductive material is wound around the conductive fiber.

16. The vehicle seat according to claim 8, wherein the capacitance detector is configured to detect a capacitance between the conductive fiber and the frame member so as to determine whether an occupant is seated in the vehicle seat.

* * * * *